United States Patent [19]

Broadt et al.

[11] 4,371,915

[45] Feb. 1, 1983

[54] PHOTOFLASH UNIT WITH REFLECTOR RECESSES FOR CIRCUIT BOARD SWITCHES

[75] Inventors: David R. Broadt, Lewisburg; Carl F. Kackenmeister, Williamsport, both of Pa.

[73] Assignee: GTE Products Corporation, Stamford, Conn.

[21] Appl. No.: 217,723

[22] Filed: Dec. 18, 1980

[51] Int. Cl.³ .............................................. G03B 15/02

[52] U.S. Cl. ........................................ 362/15; 362/11; 362/13

[58] Field of Search ...................... 362/11, 13, 14, 15, 362/16, 8

[56] References Cited

U.S. PATENT DOCUMENTS 4,136,377 1/1979 Fohl ..................................... 362/13

4,320,440 3/1982 Brower ................................ 362/13

*Primary Examiner*—Donald P. Walsh

*Attorney, Agent, or Firm*—Edward J. Coleman

[57] ABSTRACT

A photoflash unit comprising a plurality of 2n flashlamps attached to a printed circuit board and disposed in a linear array with the longitudinal axes of respective lamps aligned in parallel. The circuit board has a substantially rectangular portion with n spaced apart extensions projecting vertically from a longer side thereof, the extensions being located behind alternate lamps of the linear array. Each extension contains portions of circuit patterns bridged by a mass of switch material to provide a solid state radiation switch on each extension and adjacent to a respective lamp for receiving radiant energy emitted by that lamp. The unit further includes a plurality of reflector cavities within each of which a respective one of the flashlamps is nested. Each reflector cavity includes a recessed rear wall section for accommodating a circuit board extension, such that each of the extensions are disposed between a respective lamp envelope and the recessed rear wall of the associated reflector. With the lamp contiguous with an upper portion of each reflector cavity and each circuit board extension contiguous with a recessed lower portion of a respective cavity, substantially equal predetermined spacings are maintained between the switches of the n extensions and the alternate lamp envelopes associated therewith.

14 Claims, 7 Drawing Figures

PHOTOFLASH UNIT WITH REFLECTOR RECESSES FOR CIRCUIT BOARD SWITCHES

BACKGROUND OF THE INVENTION

This invention relates to multilamp photoflash units having circuit means for causing a different lamp to be flashed upon each occurrence of a firing pulse produced in synchronism with the opening of a camera shutter. More specifically, the invention relates to such multilamp photoflash units having a plurality of associated lamp-receiving reflector cavities.

Numerous multilamp photoflash arrangements with various types of sequencing circuits have been described in the prior art. Series and parallel-connected lamp arrays have been shown which are sequentially fired by mechanical switching means, simple electrical circuits, switching circuits using the randomly varied resistance characteristics of the lamps, arc gap arrangements, complex digital electronic switching circuits, light-sensitive switching means and heat-sensitive switching devices which involve melting, fusing or chemical reaction in response to the radiant energy output of an adjacently located flashlamp.

One currently marketed eight-lamp photoflash unit employing radiation switches is described in U.S. Pat. Nos. 3,894,226 and 4,017,728 and referred to as a Flip Flash. A ten-lamp version is described in U.S. Pat. Nos. 4,156,269 and 4,164,007. The unit comprises a planar array of high voltage flashlamps mounted on a printed circuit board with an array of respectively associated reflectors disposed between the lamps and the circuit board. Circuitry on the board includes a plurality of solid state switches that chemically change from a high to low resistance, so as to become electrically conducting after exposure to the radiant heat energy from an ignited flashlamp operatively associated therewith. Radiation transfer between a lamp and switch is facilitated by an adjacent aperture or light-transmitting area in the associated reflector cavity. The lamps of the array are arranged in two equal groups disposed in the upper and lower halves respectively of the rectangular shaped circuit board. A pair of terminal contacts at the lower end of the unit is provided for activation of the upper group of lamps while a set of terminal contacts at the top of the unit is operatively associated with the lower group of lamps. The application of successive high-voltage pulses (e.g., 500 to 4,000 volts from, say, a piezoelectric source controlled by the shutter of a camera in which the array is inserted) to the terminal contacts at the lower end of the unit causes the lamps at the upper half of the array to be sequentially ignited. The array is then turned end for end and again inserted into the camera in order to flash the remaining group of lamps. In the flip flash unit, therefore, all of the lamp sequencing circuitry is self-contained in the removable photoflash unit, and the only function of the camera is to produce successive firing pulses in response to actuation of the camera shutter.

Another type of multilamp array currently on the market employs lamp-reflector units in linear rows facing in opposite directions, such as described in U.S. Pat. Nos. 3,598,984; 3,598,985; and 4,032,769 referred to as a Flash Bar. Typically, such a linear photoflash lamp array comprises a total of ten lamps arranged in two parallel rows of five lamps each, the lamps and reflectors of one row being staggered relative to the lamps and reflectors of the other row. The five lamps facing in one direction are connected to a respective firing circuit disposed on one side of a printed circuit board having a plug-in tab, and the five lamps facing in the opposite direction are connected to a respective firing circuit on the opposite side of the printed circuit board. Each of the lamps has a pair of lead-in wires, one of which is connected to a common circuit run which leads to a common terminal on the plug-in tab, while the other lead-in wire of each of the lamps of a group of five facing in one direction are connected to respective conductor runs leading to a set of five selective terminals on the respective side of the circuit board tab, e.g., see the aforementioned U.S. Pat. No. 3,598,985. The circuitry of this prior art flash bar unit contains no switching elements; hence, as described, for example in U.S. Pat. Nos. 3,618,492 and 3,757,643, one-at-a-time sequencing of the five lamps facing in one direction is provided by sequential application of low voltage firing pulses across the associated common terminal and successive ones of the associated selective terminal. That is, when the linear flash bar array is plugged into a camera, each time the shutter is actuated, electronic switching circuitry in the camera successively applies firing pulses in sequence to the five selective terminals (and associated common terminal) on the side of the circuit board to which the five lamps facing the camera subject are connected. When the five lamps facing in one direction are expended, the flash unit must be removed from the camera, rotated 180° degrees, and then reinserted in the camera circuit so that the five unused lamps are connected to the camera switching circuitry.

In the interests of compactness, simplicity of operation, and increasing the number of flash illuminated photographs that may be taken in rapid succession, it is desirable to provide a multilamp photoflash array in which all of the lamps face in the same direction and only a single set of connector terminals is required, so that removal and reorientation of the flash unit is unnecessary. Further, it is particularly desirable to provide a photoflash lamp array which is compatible with existing camera circuitry.

The aforementioned objects are attained by a photoflash unit described in a copending application Ser. No. 217722, filed concurrently herewith and assigned to the present assignee. The unit has means for sequentially flashing pairs of lamps (one at a time) in an array using only one selective terminal per lamp pair together with a common circuit terminal. More specifically, the photoflash unit comprises a plurality of 2n flashlamps attached to a printed circuit board and disposed in a linear array with the longitudinal axes of respective lamps aligned in parallel. Circuit patterns on the circuit board include a plurality of n selective terminal means, each associated with a respective pair of the lamps and connected to one lead-in wire of each of the lamps of the associated pair, and a common terminal associated with all of the 2n lamps but directly connected to the other lead-in wire of one lamp of each pair. The circuit board has a substantially rectangular portion with n spaced apart extensions projecting vertically from a longer side thereof, the extensions being located behind alternate lamps of the linear array. Each extension contains portions of the circuit patterns spaced apart to form predetermined gaps, and a mass of switch material is disposed on each extension to bridge the gap between circuit patterns to thereby provide a solid state radiation switch on each extension behind and adjacent to a respective lamp for receiving radiant energy emitted by that lamp. In this manner, a respective normally open switch on each circuit board extension is coupled between the common terminal and a lead-in wire of the other lamp of each pair of lamps, so that the n normally open switches are coupled between the common circuit lead-in wire of associated pairs of the 2n lamps.

The last-mentioned photoflash unit is particularly useful for low light output arrays of lamps designed to be used with high-speed films and operated by camera generated low voltage firing pulses. With such an array, it is necessary to space the solid state radiation switch and the lamp very closely together in order to provide proper functioning of the switch. Thus, insufficient space remains between lamp and switch to allow for the positioning of a reflector therebetween. Positioning the solid state radiation switch between the reflector and lamp assures the necessary close proximity of the switch to the lamp; however, such an arrangement poses problems with respect to lamp positioning in the reflector and the related reflector efficiency. Further, there is a problem of maintaining a controlled and repeatable spacing between a unit containing a multiplicity of lamps and a plurality of switches associated with respective selected lamps. A predetermined spacing is desired to insure reliable switch operation while preventing undesired direct contact between the surface of the lamp envelope and the surface of the mass of switch material.

SUMMARY OF THE INVENTION

Accordingly, it is an object of the present invention to provide a multilamp photoflash unit having improved means for permitting selective flashing of the lamps thereof.

A principal object of the invention is to provide an improved multilamp photoflash unit having an arrangement of solid-state radiation switches on a printed circuit board and associated reflector cavities for the respective lamps of the unit, whereby reliable operation of the switches is accommodated while maintaining optimum lamp positioning within each reflector cavity.

These and other objects, advantages and features are attained, in accordance with the invention, by a photoflash unit comprising, in combination, a printed circuit board having electrically conductive circuit patterns disposed on a surface thereof, and a plurality of flashlamps attached to the circuit board and electrically connected to respective portions of the circuit patterns, each of the lamps having a tubular envelope. The circuit board has a substantially rectangular portion with at least one extension projecting from a side thereof, the extension being located behind an associated one of the lamps with the plane of the extension being parallel with the longitudinal axis of the associated lamp. The circuit board extension contains portions of the conductive circuit patterns spaced apart to form one or more predetermined gaps therebetween, and a mass of switch material is disposed thereon to bridge the gaps; in this manner, a solid-state radiation switch is provided on the extension behind an adjacent to an associated one of the lamps for receiving radiant energy emitted by that lamp. The unit further includes means containing a plurality of lamp-receiving cavities, each of the cavities being provided with reflective surfaces on the interior thereof which define an opening in the front of the cavity. Each flashlamp is nested in one of the reflective cavities with the longitudinal axis of the lamp parallel to the longitudinal axis of the cavity. One of the reflective cavities has a rear wall with a recessed portion for accomodating the extension of the circuit board, the circuit board extension being disposed between the lamp associated therewith and the rear wall of the recessed portion of the reflective cavity.

In a preferred embodiment, the photoflash unit comprises a plurality of 2n flashlamps attached to the circuit board and disposed in a linear array with the longitudinal axes of respective lamps aligned in parallel. The circuit board has n of the extensions spaced apart and projecting from a longer side thereof, the extensions being located behind alternate lamps of the array. Each of the reflective cavities have first and second rear wall sections with the second section being recessed from the first section for accomodating a circuit board extension. In this manner each of the end extensions is disposed between the lamp envelope associated therewith and the second rear wall section of the associated reflector. In each cavity, the recessed second rear wall section is axially aligned with and disposed between the first rear wall section of the cavity and the rectangular portion of the circuit board, and portions of the alternate lamp envelopes associated with the n extensions of the circuit board are contiguous with the first rear wall sections of the reflective cavities associated therewith. Further, the n extensions to the circuit board are contiguous with the recessed second rear wall sections of the reflective cavities associated therewith, whereby substantially equal predetermined spacings are maintainined between the solid state switches of the n extensions and the alternate lamp envelopes associated therewith.

Accordingly, in the photoflash unit of the present invention, close proximity of the solid-state switches on the circuit board extensions to the associated flashlamps is provided by a reflector configuration which accomodates positioning the switch between the reflector and lamp while at the same time, by means of the unrecessed rear wall, maintaining optimum lamp positioning within the reflector. Further, the described recessing of the rear wall of the reflector, with the circuit board extensions and lamp contiguous to the respective rear walls, facilitates control of the spacing between the lamp and the switching on the circuit board. Finally, a degree of protection is provided for the switch by enclosing portions of the circuit board extension within the reflector recess.

BRIEF DESCRIPTION OF THE DRAWINGS

This invention will be more fully described hereinafter in conjunction with the accompanying drawings, in which.

DESCRIPTION OF PREFERRED EMBODIMENT

Figure 1:
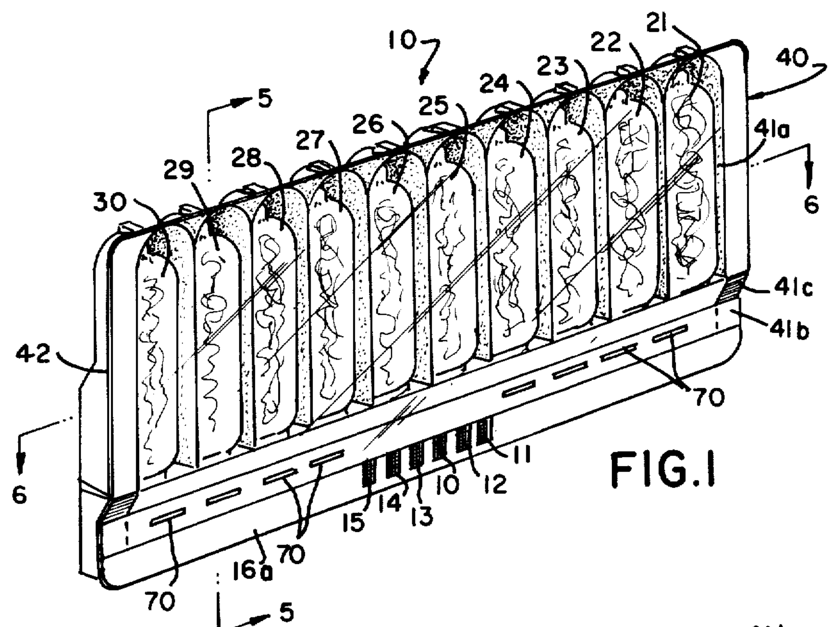
FIG. 1 is a perspective view of one embodiment of a multilamp photoflash unit in accordance with the invention.
Figure 2:
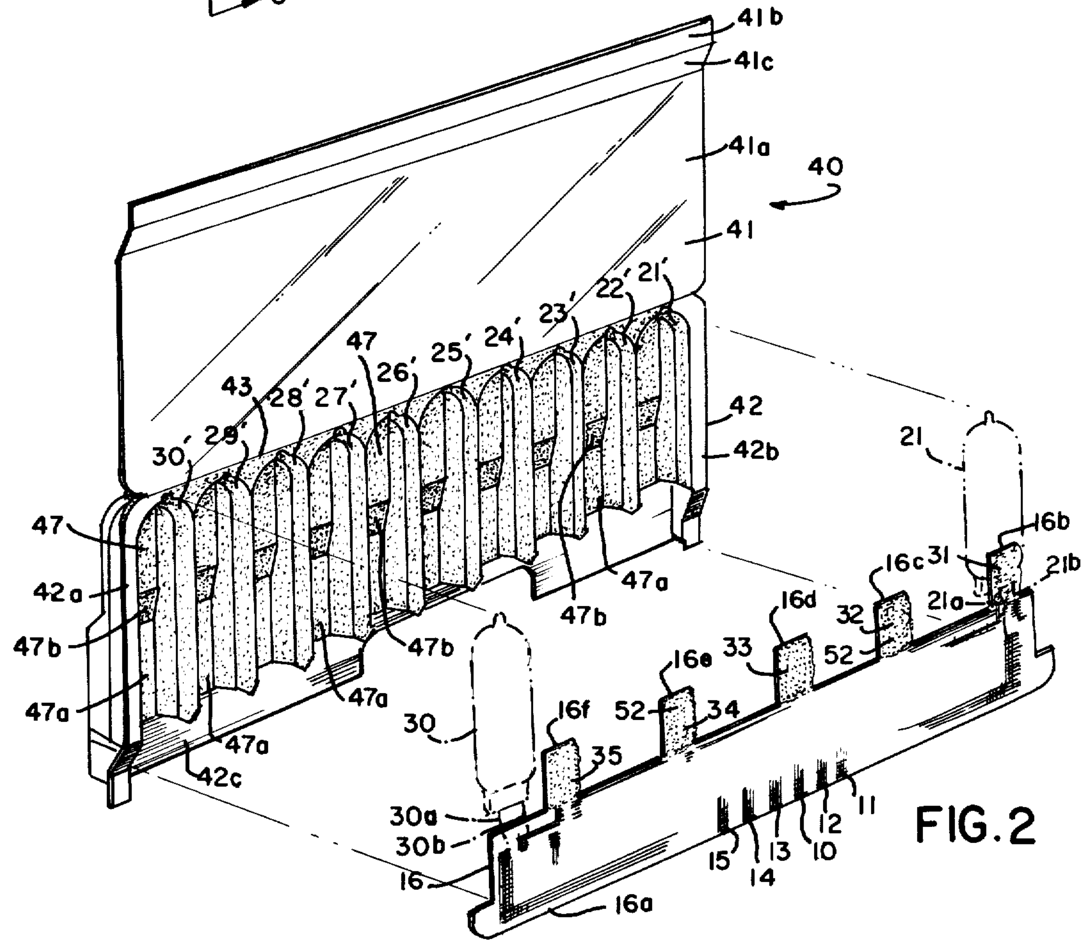
FIG. 2 is a perspective view of the unit of FIG. 1 with the housing unfolded and in exploded relation to the associated printed circuit board, with only two of the attached lamps being illustrated in phantom.
Figure 3:
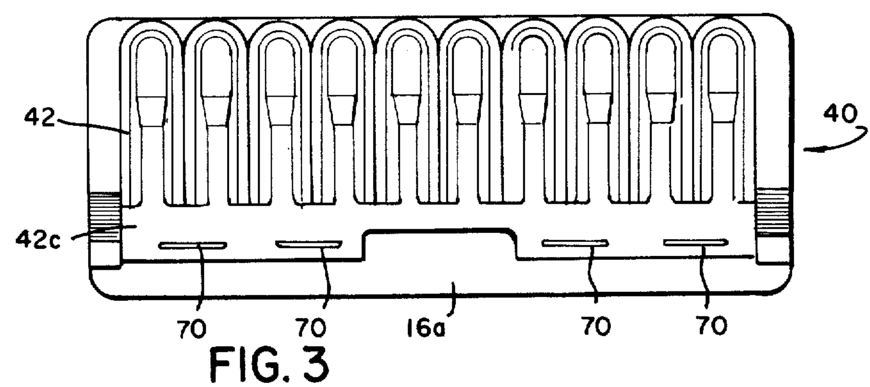
FIG. 3 is a rear elevational view of the unit of FIG. 1.

FIGS. 1-3 illustrate one embodiment of a multilamp photoflash unit 10 comprising a horizontal array of ten flashlamps 21-30 mounted on a printed circuit board 16. Each of the lamps has a pair of lead-in wires 21*a*, 21*b*, etc., connected to the printed circuitry on the board 16. Each of the lamps 21, etc., has a tubular light-transmitting glass envelope having a press seal base at one end through which the lead-in wires emerge and a tip-off at the other end, the exterior of the envelope is coated with a transparent protective material, such as cellulose acetate lacquer, and the interior is filled with a quantity of filamentary combustible material, such as shredded zirconium, and a combustion supporting gas, such as oxygen. The ignition means within the lamp envelope may comprise, in the case of a low voltage source, a filament connected across the inner ends of the lead-in wires with beads of primer material disposed about the junction of the lead-in wires and the filament.

The circuit board 16 is generally of the same type described in the aforementioned copending application Ser. No. 217722 filed Dec. 12, 1980, except that the depending tab is wide rather than narrow. More specifically, the circuit board 16 has a substantially rectangular portion with a depending tab 16*a* which is somewhat wider than the above-mentioned rectangular portion. The long upper side of the circuit board has five spaced apart extensions 16*b*-16*f* which extend vertically above the rectangular portion of the circuit board. The ten lamps 21-30 attached to this circuit board are disposed in a horizontal linear array with the longitudinal axes of respective lamps aligned in parallel. The lamps and circuit board extensions are disposed at regular intervals, as illustrated, with the circuit board extensions being located behind alternate lamps of the linear array. Thus, extension 16*b* is disposed behind lamp 21; extension 16*c* is disposed behind lamp 23; extension 16*d* is disposed between lamp 25; extension 16*e* is disposed behind lamp 27; and extension 16*f* is disposed behind lamp 29. Further lamp 22 is disposed behind the extensions 16*b* and 16*c*; lamp 24 is disposed between the extensions 16*c* and 16*d*; lamp 26 is disposed between the extensions 16*d* and 16*e*; lamp 28 is disposed between the extensions 16*e* and 16*f*; and lamp 30 is disposed between extension 16*f* and the end of the circuit board.

Located adjacent to one another on tab 16*a* are terminal areas 10-15 at one side edge thereof which are respectively interconnected via conductor runs, either directly or through switches 31-35, with a plurality of contact areas disposed on the rectangular portion of the circuit board and connected to the lamp lead-in wires 21*a*, 21*b* through 30*a*, 30*b*.

As discussed in detail in the aforementioned copending application Ser. No. 217,722, the terminal 10 forms part of, and is connected to, a common circuit conductor run which is directly connected in electrical circuit to a lead-in wire of one of the lamps of each of respective pairs of the lamps; more specifically, the common conductor is connected to a lead-in wire of lamps 21, 23, 25, 27 and 29. Each of the selective terminals 11-15 is connected in electrical circuit to a lead-in wire of each of the lamps of a respective pair of lamps; more specifically, selective terminal 11 is directly connected to lamps 21 and 22; terminal 12 is directly connected to lamps 23 and 24; terminal 13 is directly connected to lamps 25 and 26; terminal 14 is directly connected to lamps 27 and 28; and terminal 15 is directly connected to lamps 29 and 30.

The common terminal 10 and the five selective terminals 11-15 on the tab 16*a* are adapted for engagement with the socket contacts of a source of lamp firing pulses. For example, the source of firing pulses for connection to these terminals may comprise an electronic circuit such as described in U.S. Pat. No. 3,618,492, which may be incorporated in a camera or a flash attachment for use with a camera and adapted to generate low voltage pulses in synchronization with the actuation of a camera shutter mechanism.

The entire printed circuit is provided on the same one side of the circuit board, namely, the obverse side of the board to which the flashlamp lead-in wires are connected. The substrate of the circuit board 16 comprises an insulating material, such as XP phenolic, and the pattern of electrically conductive circuit runs is provided on the board surface by means such as silk screening, chemical etching, etc. According to a preferred embodiment, however, the circuit patterns are formed of die-stamped copper, thereby providing significant cost advantages. For example, U.S. Pat. No. 3,990,142 describes a die-stamped printed circuit board and copending applications Ser. Nos. 131,614 and 131,711, both filed Mar. 19, 1980, and assigned to the present assignee, describe die-stamped circuit boards for photoflash devices.

Figure 4:
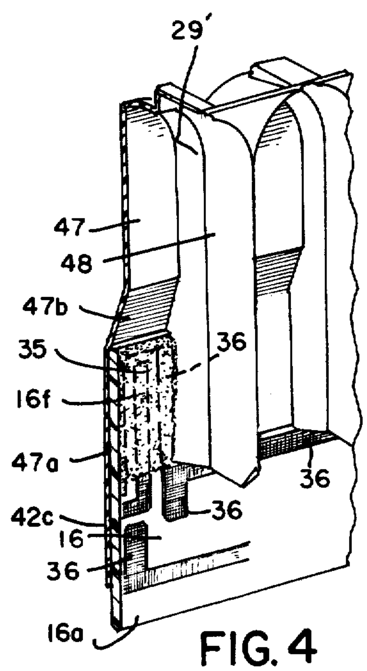
FIG. 4 is an enlarged fragmentary detailed view of a portion of the unit of FIG. 1 showing one of the circuit board extensions positioned in a cavity recess.

The switches 31-35 function as normally open connect switches and each preferably comprises a solid-state mass of material interconnected to spaced apart electrical terminals in the circuit, as more thoroughly described in the aforementioned copending application Ser. No. 217,722, filed Dec. 12, 1980. Each of these switches is located on a respective one of the circuit board extensions and is formed by portions of the conductive circuit patterns 36 spaced apart on the extensions to form predetermined gaps therebetween (as illustrated with dashed lines in FIG. 4 and by cross section in FIG. 7) and having a mass of switch material 52 disposed thereover to bridge the gap between the circuit patterns. In the embodiment illustrated, the mass of switch material 52 is disposed on at least a portion of each of the extensions to cover substantially the full width thereof and thereby bridge and interconnect vertically extending circuit conductors on the surface of the extension. The material 52 for the connect switches is selected to be of the type initially having an open circuit or high resistance, the resistance thereof becoming converted to a lower value when the material receives radiation in the form of heat and/or light from a respective, adjacent lamp upon the lamp being flashed. One type of solid-state switch which operates in this manner is described in U.S. Pat. No. 3,458,270 of Ganser et al, in which the use of silver oxide in a polyvinyl binder is taught as a normally open radiant energy switch. Upon radiant heating, the silver oxide decomposes to give a metallic silver residue which is electrically conductive.

A preferred switch composition for a photoflash array operated by low volage firing pulses, such as the present specific embodiment, is described in a copending application Ser. No. 148,358, filed May 9, 1980 and assigned to the present assignee, and comprises, by dried weight 35–70% silver carbonate and/or silver oxide, 30–60% silver-coated beads, and 1–20% binder. Further modifications of the switch composition for facilitating control of the switch conversion time are described in a copending application Ser. No. 148,119, filed May 9, 1980 and assigned to the present assignee. A specific example of a low voltage switch composition particularly useful in this application and described in the aforementioned copending application Ser. No. 148,358, comprises the following dried weight proportions: 50% silver carbonate, 40% silver-coated glass beads, and 10% polystyrene binder. The mixture is made into a paste by ball milling in a suitable solvent such as butyl cellosolve acetate. The solids content may be adjusted to the suit the method of switch application. For silk screening over the circuit board, we prefer to adjust the solids content to about 74%. This low voltage switch paste was then screen printed using a 105 mesh stainless steel screen with a 2 mil emulsion build-up.

In a generally similar manner to that described in copending application Ser. No. 181,938, filed Aug. 27, 1980 and assigned to the present assignee, the lamp assembly and a portion of the circuit board are enclosed in a comparatively simple and compact housing construction. More specifically, the unit enclosure comprises a one-piece housing member 40 having a light-transmitting front portion 41 folded over a back portion 42 containing a plurality of, in this case 10, lamp-receiving cavities 21'–30', which preferably have a reflective surface. For example, the housing member may comprise a formed sheet of plastic film, such as cellulose propionate having a thickness of about 30 mils, prepared by injection molding, thermoforming a plastic sheet or film, or any other suitable means. As best shown in the unfolded illustration of FIG. 2, the housing member contains a linear fold 43 which separates the front and back portions, and when the housing member is folded over, this linear fold 43 is disposed horizontally along the top of the horizontal array of lamp-receiving reflective cavities 21'–30'.

In order to facilitate securing of the housing once it is folded over, the back portion 42 is provided with side flanges 42*a* and 42*b*, which extend on each side of the array of cavities, and an elongated tab 42*c* which extends below the array of cavities. The front portion 41 of the housing includes a transparent window area 41*a*, which is substantially planar, and an elongated tab 41*b* which extends below the window area and is disposed in a plane which is substantially parallel to but offset from the plane of the window area. The front portion 41 further includes a web 41*c* which joins the window area 41*a* with the tab 41*b*.

Figure 5:
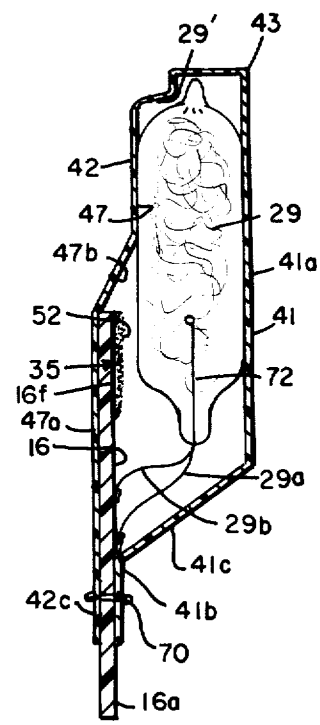
FIG. 5 is an enlarged sectional side view of FIG. 1 taken along lines 5—5 and showing the relative positions of the circuit board extension and lamp within one of the reflector cavities, the spacing therebetween being exaggerated.
Figure 6:
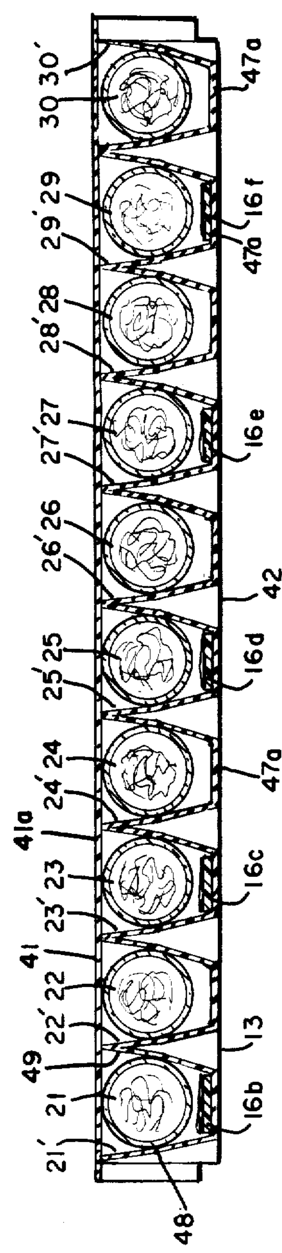
FIG. 6 is an enlarged planar sectional view of FIG. 1 taken along lines 6—6, with the spacing between the switches and lamps being exaggerated.
Figure 7:
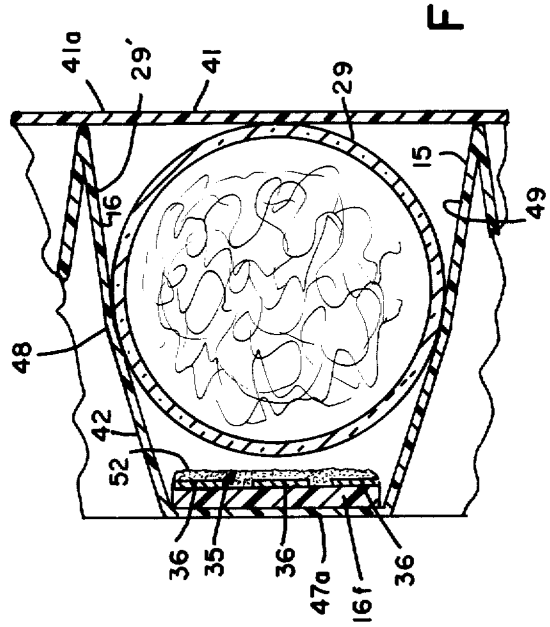
FIG. 7 is an enlarged view of a single reflective cavity of FIG. 6 showing the relative position of the lamp and circuit board extension therein, the spacing therebetween being exaggerated.

In accordance with the present invention, each of the reflective cavities 21'–30' has a rear wall 47 with a recessed lower portion 47*a* for accomodating the rectangular extensions 16*b*–16*f* of the circuit board. The fit of the circuit board extensions within the reflective cavity recesses is illustrated in the different views of FIGS. 4–7. In the preferred embodiment illustrated, both the upper and lower rear wall sections 47 and 47*a* are planar and joined to a pair of oppositely disposed bi-planar side wall sections 48 and 49, as described in a copending application Ser. No. 217,721, filed concurrently herewith and assigned to the present assignee. The bi-planar side sections 48 and 49 extend outwardly from the planar rear section 47 (and section 47*a*) to form a reflective surface opening. As best shown in FIG. 5, each flashlamp (such as lamp 29) has a tubular envelope nested within a respective reflective cavity (such as 29') contiguous with the upper rear wall section 47 and surfaces of the side walls 48 and 49 (see for example FIG. 7), and the longitudinal axis of each lamp envelope is disposed parallel to the longitudinal axis of the reflective cavity. It is to be noted that when the front portion 41 of the housing is folded over, the front window area 41*a* covers the reflective cavity openings and encloses the flashlamps within the cavities. Further, the aperture plane of each reflector cavity, represented by the position of the front window portion 41*a*, is substantially contiguous with the front surface of each lamp envelope. Accordingly, each lamp is compactly nested and securely held in position in a respective reflective cavity. Further, as best shown in FIGS. 5 and 7, the generally rectangular rear wall recesses 47*a* serve to accomodate the solid-state radiation switches (such as switch 35) on the rectangular circuit board extensions while at the same time maintaining optimum lamp-to-reflector positioning at the upper portion of the reflective cavity and on the sides. For example, as discussed in the aformentioned copending application Ser. No. 217,721 it has been found that the planar rear wall section (such as 47) provides a gain in total lumen output over an arcuate rear wall section. Of course, depending upon the configuration of the switching means utilized, various types, sizes, and shapes of recesses may be provided to maximize the utilization of space and materials. Further, as shown in FIGS. 5 and 7, by proper sizing of the switching recess, with the circuit board extension positioned contiguous with the lower rear wall section 47*a* and the upper portion of the lamp envelope held contiguous with the upper rear wall section 47, it is possible to provide a controlled and repeatable spacing between each lamp and its respective solid-state switch, thus ensuring reliable switch operation while preventing harmful direct contact between the lamp surface and the switch.

Additionally, as discussed in the copending application Ser. No. 217,721 a comparatively simple and low cost method of producing means, such as the abovementioned housing member 40 having a plurality of lamp-receiving cavities is a thermovacuum-forming technique utilizing a thin, thermoplastic film. It has been found that vacuum forming to provide a planar rear wall section 47 (and 47*a*) and a very low reflector opening-to-depth ratio, e.g. of less than about 1.2, tends to cause excessive thinning of the sidewall corners forming the rear wall section. This undesired excessive thinning of the rear portion of the reflector cavity is greatly reduced by providing the bi-planar oppositely disposed side sections 48 and 49. Further yet, in accordance with the present invention, it has been found to be desirable to provide a tapered planar transition 47*b* between the plane of the upper rear wall section 47 of the reflec-tive cavity and that of the recessed lower rectangular portion 47*a*. This taper eliminates stress concentrations in the reflector material at the edges of the recess.

In assembly of the unit, the lead-in wires of the flashlamps are soldered to appropriate lamp contact areas on the printed circuit board 16, and then the circuit board is aligned against the tab 42*c* of the housing, with each of the circuit board extensions 16*b*–16*f* (including switches 31-35, respectively) disposed in a respective one of the lower recesses 47*a* of respective cavities 21', 23', 25', 27' and 29'. At the same time, each of the lamps 21-30 is disposed in a respective one of the cavities 21'-30' with the rear wall of the lamp envelope contiguous with the rear wall 47 of the reflective cavity. The front portion of the housing is then folded over with the circuit board 16 sandwiched between tabs 41*b* and 42*c* and the window area 41*a* enclosing the lamps in their respective cavities. In this manner, the window area is essentially adjacent to the lamps and the top and side peripheries of the lamp-receiving cavities are substantially in abutment with the window area of the folded over front portion so that individual chambers enclose each of the lamps. The bottom of each such chamber has an opening, as illustrated, through which each pair of lamp lead-in wires pass through to their electrical connection areas on the circuit board. In this manner, as best illustrated in FIG. 5, the housing web 41*c* encloses the lamp lead-in wires and the contact areas on the circuit board to which the wires are connected. The housing is then secured together, such as for example by disposing staples 70 along the bottom of the folded over housing member with each pair of staple legs extending through the printed circuit board and being clinched together on the other side. For example, as illustrated in FIG. 3, each staple 70 may be inserted through the tab 42*c* at the back of the unit whereat the center region of each staple is visible, and then the staple legs are clinched together onto the external surface of the front portion of tab 41*b*, as visible in FIG. 1. Then, the back housing side flanges 42*a* and 42*b* are aligned with the side portion of the front window area 30*a* such that an adhesive or other securing means may be disposed therebetween to seal together the sides of the housing.

Hence, in the completed unit, with the lower recessed rear wall section 47*a* axially aligned with and disposed between the upper rear wall section 47 of each cavity and the main rectangular portion of the circuit board 16, and with the recessed rear wall sections 47*a* of each cavity in the housing being maintained at an equal spacing from the respective upper rear wall section 47, substantially equal predetermined spacings are maintained between the solid state switches 31-35 of the circuit board extensions 16*b*-16*f* and the alternate lamp envelopes associated therewith, namely, lamps 21, 23, 25, 27 and 29. In this manner it is possible to allow close spacing between the lamp and switch while maintaining an optimumly positioned reflector. Further, the walls of the reflector additionally provide physical protection for each switch.

As discussed in the aforementioned copending application Ser. No. 217,722 each of the extended portions of the circuit board that support a radiation-activated switch should be sized so that the width thereof is at least one-half the inside diameter of the respectively adjacent lamp envelope, and the vertical projection of the extension above the rectangular portion of the circuit board is at least one-half of the height of the ignition means 72 in the respectively adjacent lamp (See FIG. 5). In a preferred con-struction, each of the circuit board extensions has a width of about 0.170 inch (85% of the ID of the lamp envelope) and a length of 0.400 inch (120% of the height of the ignition means).

Although the invention has been described with respect to specific embodiments, it will be appreciated that modifications and changes may be made by those skilled in the art without departing from the true spirit and scope of the invention. For example, n may be two or greater, i.e., the circuit board extension approach is applicable to arrays of four lamps, six lamps, eight lamps, etc. In fact, the recessed reflector and circuit board extension arrangement may be applied to an array of only two lamps. Further, it is not necessary that each of the aligned reflector cavities of a housing contain a recessed rear wall; the recess is only necessary in those cavities associated with a projecting circuit board extension carrying a solid-state switch. Also, tab 16*a* may be much narrower than the main rectangular portion of the circuit board 16.

We claim:

1. A multilamp photoflash unit comprising, in combination:
  - a printed circuit board having electrically conductive circuit patterns disposed on a surface thereof;
  - a plurality of flashlamps attached to said circuit board and electrically connected to respective portions of said circuit patterns, each of said lamps having a tubular envelope;
  - said circuit board having a substantially rectangular portion with at least one extension projecting from a side thereof, said extension being located behind an associated one of said lamps with the plane of the extension being parallel with the longitudinal axis of the associated lamp;
  - said circuit board extension containing portions of said conductive circuit patterns spaced apart to form one or more predetermined gaps therebetween and a mass of switch material disposed thereon to bridge said gaps, thereby providing a solid state radiation switch on said extension behind and adjacent to said associated one of the lamps for receiving radiant energy emitted by that lamp;
  - means containing a plurality of lamp-receiving cavities, each of said cavities being provided with reflective surfaces on the interior thereof which define an opening in the front of the reflective cavity;
  - each of said flashlamps being nested in a respective one of said reflective cavities with the longitudinal axis of the lamp parallel to the longitudinal axis of the respective cavity; and
  - one of said reflective cavities having a rear wall with a recessed portion for accomodating said extension of the circuit board, said circuit board extension being disposed between the lamp associated therewith and the rear wall of said recessed portion of the reflective cavity.

2. The photoflash unit of claim 1 wherein each of said flashlamps has an hermetically sealed envelope with a base at one end and an ignition means sealed through said base and extending within said envelope, said lamps are disposed base down in a horizontal array with the envelopes thereof projecting vertically aove the rectangular portion of said circuit board, and said extension of the circuit board projects vertically above the rectangular portion thereof to at least one-half of the height of the ignition means in the respectively adjacent lamp.

3. The photoflash unit of claim 2 wherein the width of said circuit board extension is at least one-half of the inside diameter of the respectively adjacent lamp envelope, and said recessed portion of one of the reflective cavities has a rectangular rear wall at the lower portion of the cavity to fit said circuit board extension.

4. The photoflash unit of claim 3 wherein the upper portion of the rear wall of the reflective cavity having a recessed lower portion is contiguous with the envelope of the lamp nested therein.

5. The photoflash unit of claim 4 wherein the rear wall of said reflective cavity with a recessed portion has a tapered transition between said upper and rectangular lower portion thereof.

6. The photoflash unit of claim 4 wherein said circuit board extension is contiguous with the rear wall of the recessed portion of the reflective cavity associated therewith, whereby a predetermined spacing is maintained between said solid state switch on said extensions and the lamp envelope associated therewith.

7. The photoflash unit of claim 1 wherein each of said flashlamps has a base at one end, said lamps are disposed base toward the circuit board in a linear array with the envelope thereof projecting away from the rectangular portion of said circuit board, and the longitudinal axis of said circuit board extension is parallel with the longitudinal axis of the lamp envelope associated therewith.

8. The photoflash unit of claim 7 wherein each of said reflective cavities has a planar rear wall section joined to a pair of oppositely disposed side wall sections, and said recessed portions of one of the reflective cavities comprises a second planar rear wall section axially aligned with and disposed between the first-mentioned planar rear wall section and the rectangular portion of the circuit board.

9. The photoflash unit of claim 8 wherein portions of the lamp envelope associated with said circuit board extension are contiguous with the first planar rear wall section and the planar side wall sections of said reflective cavity having a recessed second planar rear wall section.

10. The photoflash unit of claim 9 wherein said last-mentioned cavity has a tapered planar transition between said first and second planar rear wall sections.

11. The photoflash unit of claim 9 wherein said circuit board extension is contiguous with the second planar rear wall section of said last mentioned cavity, whereby a predetermined spacing is maintained between said solid state switch on said extension and the lamp envelope associated therewith.

12. The photoflash unit of claim 1 wherein said flashlamps comprise a plurality of 2n flashlamps attached to said circuit board and disposed in a linear array wth the longitudinal axes of respective lamps aligned in parallel, said circuit board has n of said extensions spaced apart and projecting from a longer side thereof, said extensions being located behind alternate lamps of said array, and each of said reflective cavities have first and second rear wall sections with said second section being recessed from the first section for accomodating a circuit board extension, each of said n extensions being disposed between the lamp envelope associated therewith and the second rear wall section of the reflector associated therewith.

13. The photoflash unit of claim 12 wherein said recessed second rear wall section of each reflective cavity is axially aligned with and disposed between the first rear wall section of the cavity and the rectangular portion of the circuit board, and portions of the alternate lamp envelopes associated with said n extensions of the circuit board are contiguous with the first rear wall sections of the reflective cavities associated therewith.

14. The photoflash unit of claim 13 wherein said n extensions of the circuit board are contiguous with the recessed second rear wall sections of the reflective cavities associated therewith, and the size of each of said second rear wall section recesses is predetermined and approximately equal to one another, whereby substantially equal predetermined spacings are maintained between said solid state switches of the n extensions and the alternate lamp envelopes associated therewith.

* * * * *